(12) United States Patent
Tissot et al.

(10) Patent No.: US 9,307,629 B2
(45) Date of Patent: Apr. 5, 2016

(54) LOCKING OF AN ELECTRONIC BOARD

(71) Applicant: KONTRON MODULAR COMPUTERS, Toulon (FR)

(72) Inventors: Serge Tissot, Hyeres (FR); Emmanuel Mollard, La Crau (FR); Yannick Collin, Hyeres (FR)

(73) Assignee: Kontron Modular Computers SAS (FR)

( * ) Notice: Subject to any disclaimer, the term of this patent is extended or adjusted under 35 U.S.C. 154(b) by 0 days.

(21) Appl. No.: 14/524,897

(22) Filed: Oct. 27, 2014

(65) Prior Publication Data

US 2015/0114692 A1 Apr. 30, 2015

(51) Int. Cl.
*H05K 7/20* (2006.01)
*H05K 1/02* (2006.01)
*H05K 7/14* (2006.01)

(52) U.S. Cl.
CPC ............ *H05K 1/0201* (2013.01); *H05K 7/1404* (2013.01); *H05K 7/20545* (2013.01); *H05K 2201/066* (2013.01)

(58) Field of Classification Search
CPC   H05K 1/0201; H05K 7/20545; H05K 7/1404
USPC .......................................................... 174/252
See application file for complete search history.

(56) References Cited

U.S. PATENT DOCUMENTS

| | | | | |
|---|---|---|---|---|
| 5,211,496 | A * | 5/1993 | Hurowitz | 403/24 |
| 5,483,420 | A * | 1/1996 | Schiavini | 361/707 |
| 5,506,373 | A * | 4/1996 | Hoffman | 174/373 |
| 5,677,514 | A * | 10/1997 | Schwamm | H05K 1/056 174/252 |
| 6,721,182 | B1 * | 4/2004 | Wells | H05K 7/1404 257/727 |
| 2007/0070601 | A1* | 3/2007 | Vos | H05K 7/20563 361/694 |
| 2007/0253169 | A1* | 11/2007 | Clawser | H05K 7/1404 361/720 |
| 2008/0019102 | A1* | 1/2008 | Yurko | 361/719 |
| 2010/0195287 | A1* | 8/2010 | Sundstrom | H05K 1/0207 361/720 |
| 2011/0058335 | A1* | 3/2011 | Sullivan et al. | 361/704 |
| 2011/0141692 | A1* | 6/2011 | Bult | 361/700 |

FOREIGN PATENT DOCUMENTS

EP   1853097 A2   11/2007
EP   2395827 A2   12/2011

* cited by examiner

*Primary Examiner* — Steven T Sawyer
(74) *Attorney, Agent, or Firm* — Baker Hostetler LLP

(57) ABSTRACT

An electronic board comprises a plane printed circuit, a thermal drain and an expandable locking means positioned along one edge of the printed circuit comprising a part for transmission of movement and a part mobile in translation along an axis including a component perpendicular to the printed circuit. The part mobile in translation has at least one recess opening onto a face of the expandable locking means perpendicular to the printed circuit. The locking means is designed to rigidly fix the board in a chassis and to press the thermal drain against a face of the chassis. The printed circuit comprises a region which enters into the recess or recesses of the expandable locking means.

9 Claims, 4 Drawing Sheets

LOCKING OF AN ELECTRONIC BOARD

CROSS-REFERENCE TO RELATED APPLICATION

This application claims priority to foreign French patent application No. FR 1359425, filed on Oct. 28, 2013, the disclosure of which is incorporated by reference in its entirety.

FIELD OF THE INVENTION

The invention belongs to the field of electronics and relates to the locking of an electronic board equipped with a thermal drain.

The term 'thermal drain' will refer to a heat sink used in a thermal conduction mode.

The term 'printed circuit' will refer to a bare printed circuit, in other words without components, and 'electronic board' to a printed circuit equipped with components and potentially with a thermal drain. A printed circuit is composed of an assembly of one or more conducting layers separated by an insulating material. The layers are etched in order to obtain a network of tracks.

BACKGROUND

Conventionally, modular computers are composed of electronic boards assembled and held in a chassis within slide rails perpendicular to the backplane. The electronic boards are parallel to one another. An electronic board comprises components. In operation, the components of the electronic board can dissipate a large quantity of heat. This heat must be evacuated in order to maintain a suitable operating temperature.

Two main categories of cooling exist: cooling by thermal convection and cooling by thermal conduction.

Thermal convection consists in bringing a warm body into contact with a fluid. A part of the thermal energy of the warm body is transferred to the fluid. In the field of electronics, cooling by thermal convection generally takes place with a gaseous fluid, for example air. For a better convection, it is possible to force the circulation of the fluid. For example, fans may be used in order to increase the circulation of air over the warm components on the electronic board. The heat exchange between the warm components and the air is thus improved.

Thermal conduction is a mode of heat transfer resulting from a difference in temperature between two regions of the same medium or between two different media in contact. Cooling by thermal conduction is sometimes preferred to cooling by convection in harsh environments, notably for reasons of reliability (no mobile element such as a fan) and of sealing against contaminants (dust particles, etc.). Thermal conduction cooling is one of the modes of cooling chosen for embedded modular computers.

In an electronic board, cooling by thermal conduction takes place by virtue of a thermal drain. The thermal drain is formed from a plate which can for example be made of copper, aluminium or composite materials. The thermal drain may be disposed on top of the electronic board parallel to the plane of the printed circuit. It matches the shape of the components on the board. Two locking means, known as 'wedgelocks' or 'cardlocks' in the literature, are positioned along the two edges of the board perpendicular to the backplane in order to hold the electronic board and its thermal drain tight in a chassis. The locking means is an expandable locking means which presses the thermal drain against one slide rail of the chassis. The chassis represents the cold medium. The thermal drain allows the evacuation of the heat by conduction between the hot components on the board and the chassis. The pressure of the thermal drain against the cold medium ensures a good contact and hence an efficient heat exchange.

Currently, for a version of board using conduction cooling mode, since the locking of the electronic board with its thermal drain is achieved by means of a standard locking means, the edges of the printed circuit need to be cut out. This cutting out has many drawbacks. Indeed, depending on the mode of cooling, convection or conduction, two formats of printed circuit need to be provided. This therefore requires the fabrication and the storage of two different formats of printed circuits. In addition, in order to go from a printed circuit using cooling by convection to a printed circuit using cooling by conduction, a cutting out of the printed circuit needs to be implemented. The cutting out of a printed circuit is a sensitive process. The tolerances of the cut-out with respect to the copper tracks need to be adhered to, and there is a risk of scattering of cut-out residues over the whole electronic board. Finally, with a view to a possible cutting out of the printed circuit in the case of cooling by conduction, it may not be envisaged for this part of the board to be used for the positioning of tracks or of components.

SUMMARY OF THE INVENTION

One aim of the invention is to provide a single printed circuit that is compatible with a cooling by convection and by conduction, without having to cut the board in order to convert a board assembled with its electronic components from the cooling mode by convection to the cooling mode by conduction. Another aim of the invention is to increase the dimensions of a printed circuit used in an electronic board equipped with a thermal drain in order to replicate the format of a printed circuit used in an electronic board without thermal drain and cooled by convection.

For this purpose, the subject of the invention is an electronic board comprising:
 a plane printed circuit,
 a thermal drain positioned on the printed circuit parallel to the printed circuit,
 an expandable locking means positioned along one edge of the printed circuit comprising a part for transmission of movement and a part mobile in translation along an axis including a component perpendicular to the printed circuit, the part mobile in translation disposing of at least one recess opening onto a face of the expandable locking means perpendicular to the printed circuit,
 the locking means being designed to rigidly fix the board in a chassis and to press the thermal drain against a face of the chassis,
characterized in that the printed circuit comprises a region which enters into the recess or recesses of the expandable locking means.

BRIEF DESCRIPTION OF THE DRAWINGS

The invention will be better understood and other advantages will become apparent upon reading the detailed description of one embodiment given by way of example, the description being illustrated by the appended drawings in which.

For the sake of clarity, the same elements will carry the same identifiers in the various figures.

DETAILED DESCRIPTION

Figure 1:
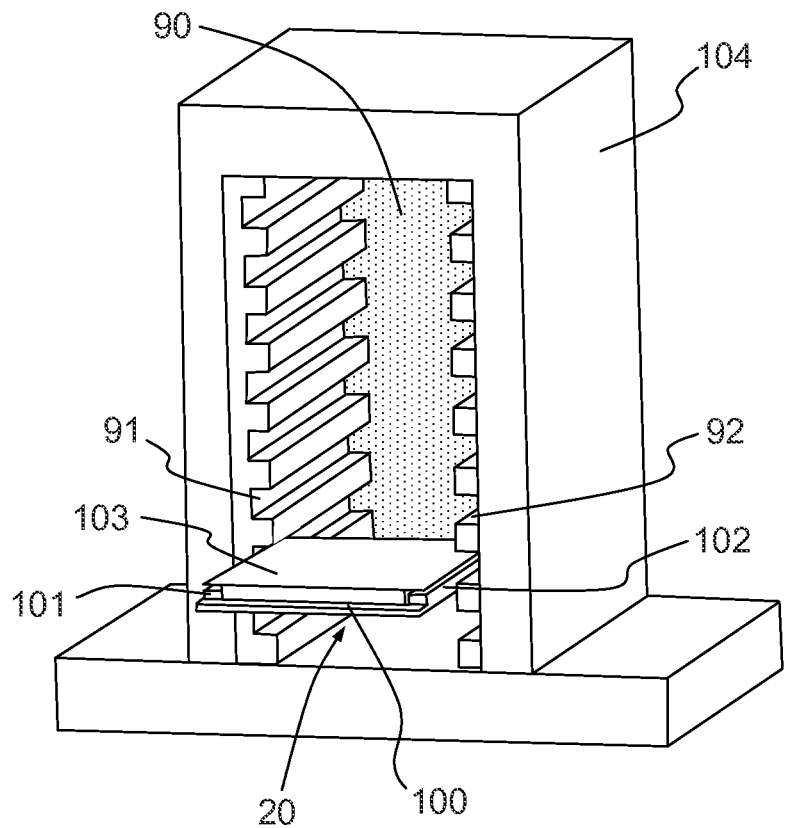
FIG. 1 shows a chassis receiving an assembled electronic board.

FIG. 1 shows a chassis 104 receiving an electronic board 20 of an assembly cooled mainly by conduction. The electronic board 20 is composed of a printed circuit 100. The electronic board 20 is held in the chassis 104 within slide rails 91 and 92 perpendicular to a backplane 90. The cooling by thermal conduction takes place by virtue of a thermal drain 103 disposed on top of the electronic board 20 parallel to the printed circuit 100. Two expandable locking means 101 and 102, also known as wedgelocks or cardlocks, are positioned along the two edges of the printed circuit 100 perpendicular to the backplane in order to hold in place the electronic board 20 and the thermal drain 103. The expandable locking means 101 presses the thermal drain 103 against the slide rail 91 of the chassis 104. Similarly, the expandable locking means 102 presses the thermal drain 103 against the slide rail 92 of the chassis 104.

Figure 2:
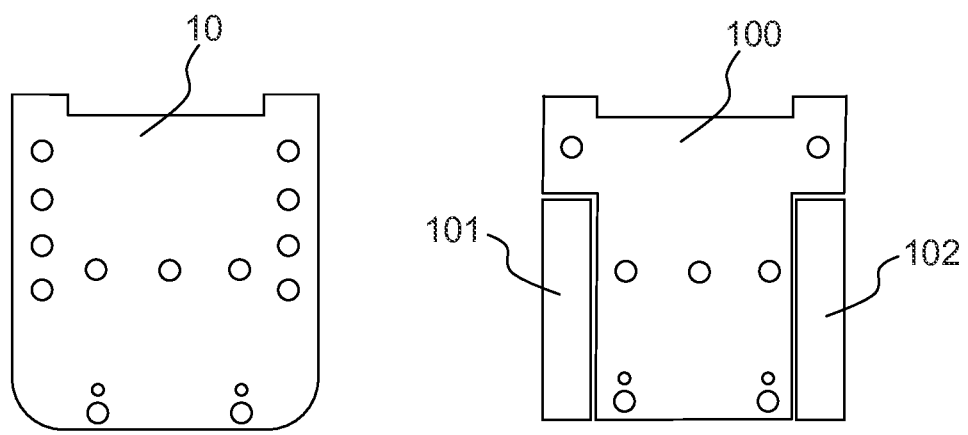
FIG. 2 shows two formats of printed circuit according to the cooling mode implemented.

FIG. 2 shows two formats of printed circuit according to the two modes of cooling by convection and by conduction. A printed circuit 10 is designed to be cooled mainly by convection. The printed circuit 100 is designed to be cooled mainly by conduction. The printed circuit 100 differs from the printed circuit 10 in that the edges perpendicular to the backplane 90 have been cut out in order to enable the positioning of the expandable locking means 101 and 102 along the two edges of the printed circuit perpendicular to the backplane 90 for locking the printed circuit 100 and the thermal drain 103.

Figure 3:
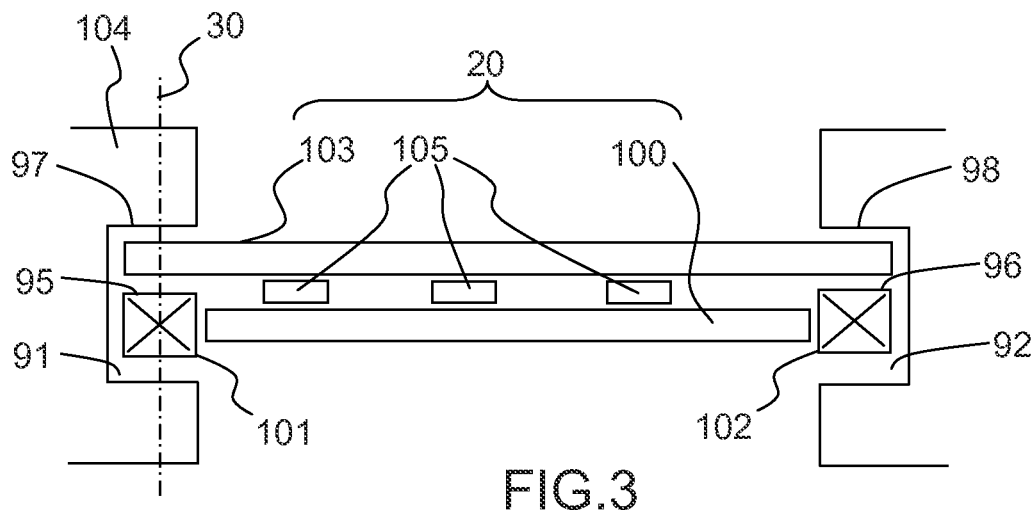
FIG. 3 shows a cross section of an assembly of an electronic board with its thermal drain and its locking means.

FIG. 3 shows, in a cross-sectional plane perpendicular to the printed circuit 100 and parallel to the backplane, one example of a standard assembly of the electronic board 20 comprising the printed circuit 100, the thermal drain 103 and the expandable locking means 101 and 102 for cooling by conduction. The electronic board 20 includes components 105. The thermal drain 103 is superposed onto and parallel to the printed circuit 100 and matches the shape of its components 105. This represents one example of an assembly. One alternative assembly consists in a thermal drain disposed between the printed circuit and the components.

Each of the expandable locking means 101 and 102 comprises a mobile part parallel to the printed circuit 100 and a part mobile in translation along an axis 30 including a component perpendicular to the printed circuit 100. In the following, the mobile part parallel to the printed circuit will be referred to as the part for transmission of movement and the part mobile in translation along an axis including a component perpendicular to the printed circuit will be referred to as the mobile part. In other words, the mobile part of the locking means can be translated along an axis perpendicular or substantially perpendicular to the printed circuit. The mobile part of the expandable locking means 101 has an upper surface 95 in a plane parallel to the plane of the printed circuit 100. Similarly, the mobile part of the expandable locking means 102 has an upper surface 96 in a plane parallel to the plane of the printed circuit 100. The thermal drain 103 is disposed on top of the printed circuit 100 parallel to the printed circuit 100. The thermal drain 103 comes into contact on the expandable locking means 101 and 102 at the upper surfaces 95 and 96 of their respective mobile part. The expandable locking means 101 is positioned in a slide rail 91 of the chassis 104 receiving the electronic board 20. Similarly, the expandable locking means 102 is positioned in a slide rail 92 of the chassis 104 receiving the electronic board 20. The clamping of the electronic board 20 and of the thermal drain 103 in the slide rails 91 and 92 is provided by the mobile parts of the expandable locking means 101 and 102 which are translatable along the axis 30 perpendicular to the printed circuit. Thus, the thermal drain 103 is pressed against a face 97 of the slide rail 91 and a face 98 of the slide rail 92. The thermal drain 103 allows the evacuation by conduction of the heat produced by the components 105 towards the chassis 104 representing the cold medium. This type of cooling is very advantageous since it allows a system that is completely hermetically sealed to be obtained. It may for example be noted that dust particles cannot get onto the electronic components thus isolated from the surrounding air, which is not the case for cooling by convection. Nevertheless, cooling by conduction requires cutting out of the edges of the printed circuit in order to be able to place the expandable locking means 101 and 102. In other words, depending on the chosen mode of cooling, two formats of printed circuits are required.

Figure 4A:
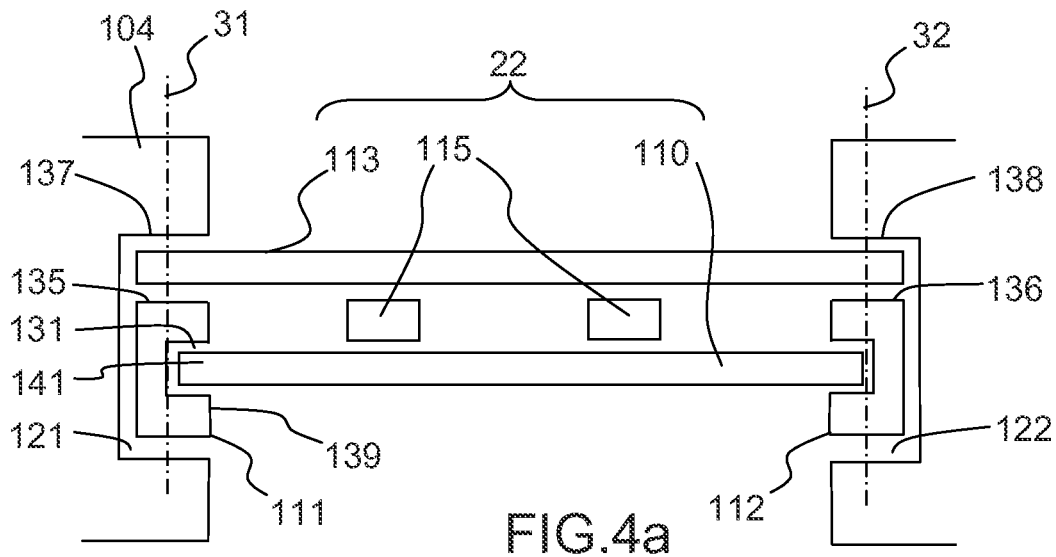
FIGS. 4a, 4b and 4c show cross sections of an assembly of an electronic board with its thermal drain and its locking means according to the invention.

FIG. 4a shows, in a cross-sectional plane perpendicular to the printed circuit and parallel to the backplane, one example of an assembly of an electronic board 22 comprising a thermal drain 113, a printed circuit 110 and two expandable locking means 111 and 112 according to the invention. The thermal drain 113 is positioned on the printed circuit 110 parallel to the printed circuit 110. The expandable locking means 111 is positioned along one edge of the printed circuit 110. The expandable locking means 111 comprises a part for transmission of movement, mobile and parallel to the printed circuit 110, and a part mobile in translation along an axis 31 including a component perpendicular to the printed circuit.

The part mobile in translation along the axis 31 of the expandable locking means 111 has an elongated shape running along one edge of the printed circuit 110. The part mobile in translation along the axis 31 has an upper surface 135 in a plane parallel to the plane of the printed circuit 110. Similarly, the mobile part of the expandable locking means 112 has an upper surface 136 in a plane parallel to the plane of the printed circuit 110. The thermal drain 113 is disposed on top of the electronic board 22 parallel to the printed circuit 110. The thermal drain 113 conforms to the shape of the components 115 and comes into contact on the expandable locking means 111 and 112 at the upper surfaces 135 and 136 of their respective mobile part. The locking means 111 is positioned in a slide rail 121 of the chassis 104 receiving the electronic board 22. The mobile part of the locking means 111 is translatable along the axis 31 including a component perpendicular to the printed circuit 110, providing the clamping of the electronic board 22 and of the thermal drain 113 in the slide rail 121 against a face 137. Thus, the expandable locking means 111 rigidly fixes the electronic board 22 in the chassis 104. Similarly, the mobile part of the locking means 112 is translatable along an axis 32 including a component perpendicular to the printed circuit 110, providing the clamping of the electronic board 22 and of the thermal drain 113 in the slide rail 122 against a face 138. The expandable locking means 111 and 112 allow the thermal drain 113 to be pressed against the faces 137 and 138 in order to evacuate the heat produced by the components 115 towards the chassis 104 by conduction.

Figure 4B:
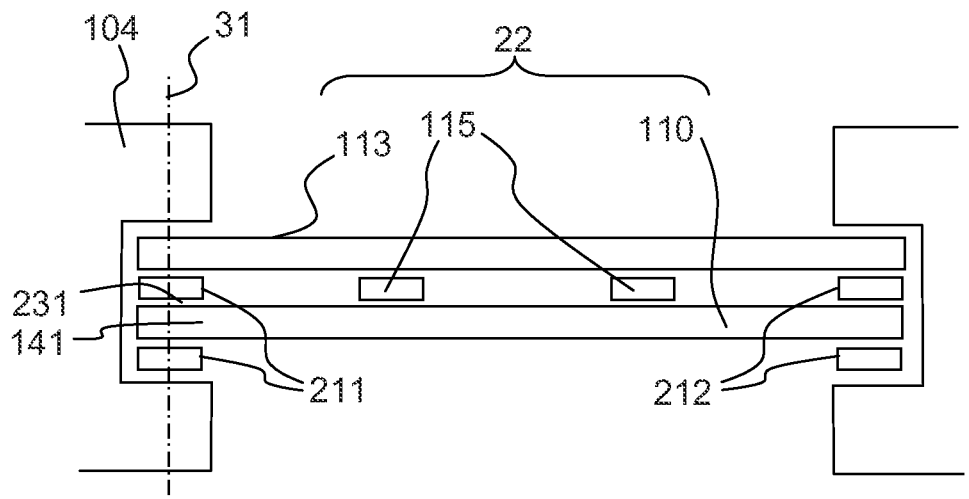
Figure 4C:
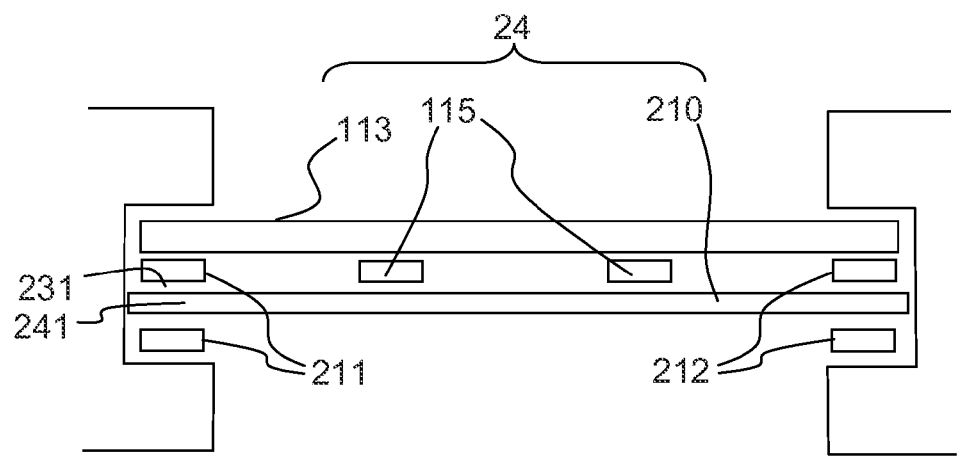

The part mobile in translation along the axis 31 of the expandable locking means 111 has a face 139 perpendicular to the printed circuit 110. The part mobile in translation along the axis 31 of the expandable locking means 111 has at least one recess 131 opening towards the printed circuit 110 on the face 139. The printed circuit comprises a region 141 which enters into the recess 131 of the expandable locking means 111. In other words, the recess 131 can accommodate the region 141 of the printed circuit 110. The recess 131 of the expandable locking means 111 may be blind, as shown in FIG. 4a. FIG. 4b is identical to FIG. 4a, and it shows a cross-sectional representation in a plane perpendicular to the printed circuit and parallel to the backplane of one example of assembly of the electronic board 22 with the thermal drain 113, the printed circuit 110 and two locking means 211 and 212 according to the invention. In the case of FIG. 4b, the locking means 211 has a through-recess 231. Lastly, FIG. 4c is identical to FIG. 4b, and it shows a cross-sectional representation in a plane perpendicular to the printed circuit and parallel to the backplane of one example of assembly of an electronic board 24 with the thermal drain 113, a printed circuit 210 and two locking means 211 and 212 according to the invention. In the case of FIG. 4c, the locking means 211 and 212 have a through-recess 231. The printed circuit 210 comprises a region 241 which enters into the recess 231 and protrudes from the recess 231. In other words, the region 241 of the printed circuit which enters into the recess 231 of the expandable locking means 211 may completely pass through the opened expandable locking means 211. When the region 241 protrudes from the recess 231, it is then possible to conserve a cooling function by convection while at the same time using a board cooled by conduction. Indeed, the board then remains mountable into the slide rail for cooling by convection by means of a circulation of air. This configuration is very advantageous since the same board test benches in production, maintenance and repair can at the same time be used for testing boards using cooling by convection and by conduction. This compatibility is imposed by the standard IEEE1101.2.

It is also possible to consider, within the scope of the invention, a region 241 which enters into the recess 231 and significantly protrudes from the recess 231. In other words, the opened expandable locking means 211 is positioned in a central area of the printed circuit 210 rather than at the edge of the printed circuit 210.

In the case of a through-recess 231, it is possible to add an additional lateral thermal pressure contact within the slide rail of the chassis. The lateral thermal pressure contact is perpendicular to the main thermal pressure contact established by the expandable locking means. The lateral thermal pressure contact can be implemented by laterally feeding a thermal conductor or a heat-pipe into the through-recess of the expandable locking means along an axis substantially parallel to the printed circuit and to the backplane.

The regions 141 and 241 of the printed circuit constitute an increase in surface area of the printed circuit with respect to a standard printed circuit 100 (FIG. 3), in other words having undergone, or having potentially to undergo, a cutting out of its edges. The increase of surface area allows additional tracks, and potentially components, to be placed. The routing of the tracks may thus be simplified, and the number of layers composing the printed circuit reduced, which leads to a reduction in the cost of the printed circuit.

Figure 5:
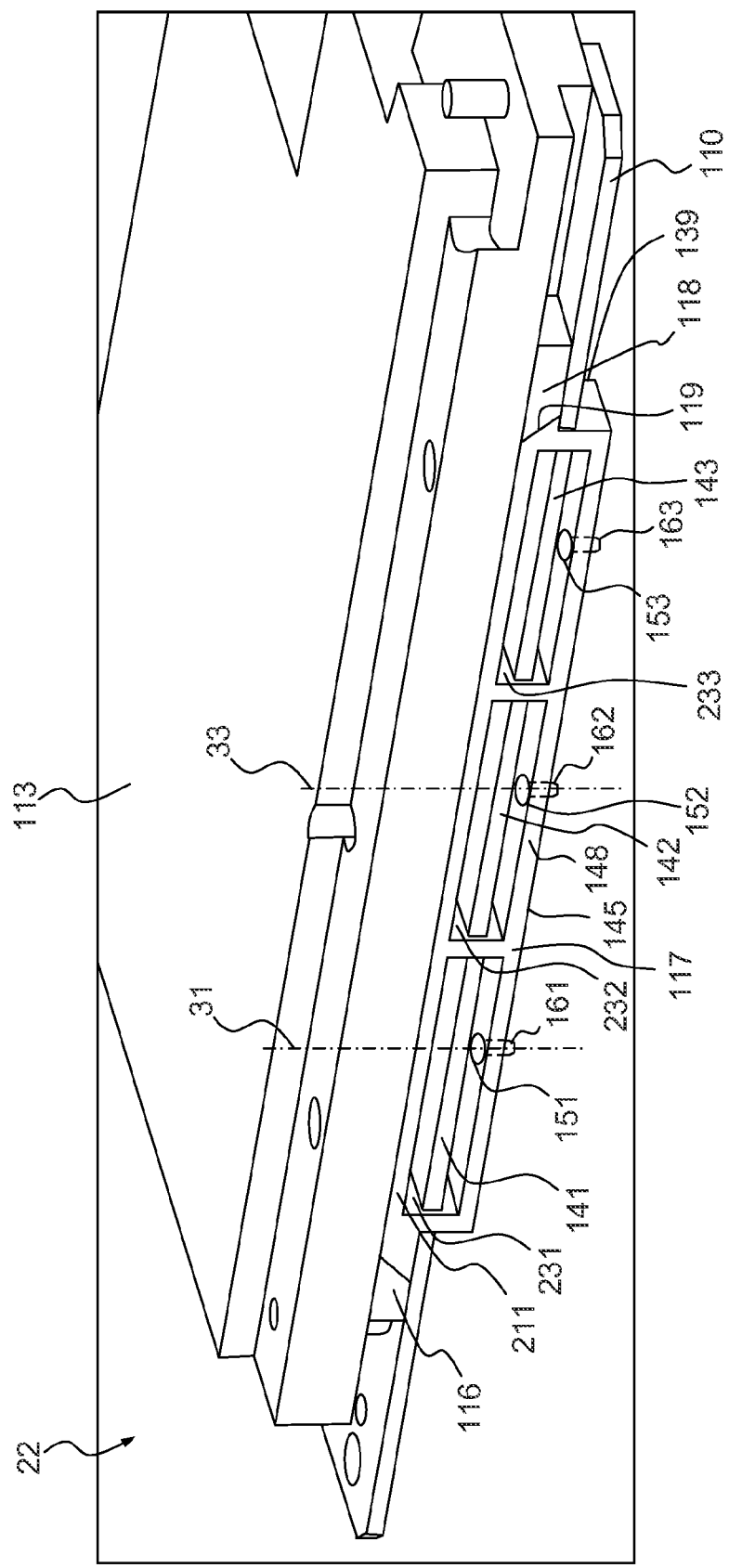
FIG. 5 shows the positioning of the printed circuit and of the thermal drain with respect to the locking means according to the invention.

FIG. 5 shows the positioning of the electronic board 22 and of the thermal drain 113 with respect to the locking means 211 according to the invention. The printed circuit 110 comprises the region 141 which enters into the recess 231 of the expandable locking means 211. The thermal drain 113 is positioned on the printed circuit 110 and parallel to the plane of the printed circuit 110. The expandable locking means 211 comprises a part for transmission of movement 116, being mobile and parallel to the printed circuit 110, a mobile part 117 which is translatable along an axis 33 including a component perpendicular to the printed circuit 110 that provides the clamping of the thermal drain 113 into the slide rail 121 (not shown in this figure). There exist several ways of generating the translational movement of the mobile part 117 along an axis including a component perpendicular to the printed circuit 110, for example by means of articulations or of corners. In FIG. 5, the translation of the mobile part 117 takes place by means of corners. The mobile part 117 disposes of a corner 119 formed by a section inclined with respect to the printed circuit 110. A mobile corner 118 parallel to the printed circuit 110 is translated towards the corner 119. By being translated, the corner 118 comes into contact with the corner 119 rigidly attached to the mobile part 117 of the expandable locking means 211. The mobile part 117 is translated along the axis 33 including a component perpendicular to the printed circuit 110.

The recess 231 opens out on the surface 139 of the mobile part 117. The mobile part 117 of the expandable locking means 211 has the lower surface 145 in the plane parallel to the printed circuit 110. A lower part 148 of the mobile part 117 is defined containing the surface 145. The lower part 148 of the mobile part 117 comprises a hole 151 passing through the lower part 148, perpendicularly to the surface 145. The hole 151 is designed to allow the passage of a means 161 for retaining the thermal drain 113 on the printed circuit 110, without having to drill into the printed circuit on the main surface designed to accommodate components. The hole 151 may be referred to as a retaining hole. Similarly, the lower part 148 of the mobile part 117 of the expandable locking means 211 may comprise several other retaining holes 152, 153 in order to allow the passage of several means 162, 163 for retaining the thermal drain 113 on the printed circuit 110. The number, the size and the shape of the holes positioned on the surface 145 are defined depending on the use envisaged so as to obtain the best compromise retention/feasibility/cost. The holes for retaining the heat drain on the printed circuit, in the framework of the invention, are thus situated in the lateral part of the board and do not encroach onto the surface area of the board available for the components, as would be the case with the conventional method where the lateral parts are cut out. The mobile part 117 of the expandable locking means 211 may dispose of several recesses 232, 233 opening onto the face 139 of the mobile part 117. In this case, the printed circuit 110 can dispose of regions 142 and 143 for receiving components and interconnection tracks. The recesses 232 and 233 can receive the regions 142, 143 of the printed circuit 110.

Figure 6:
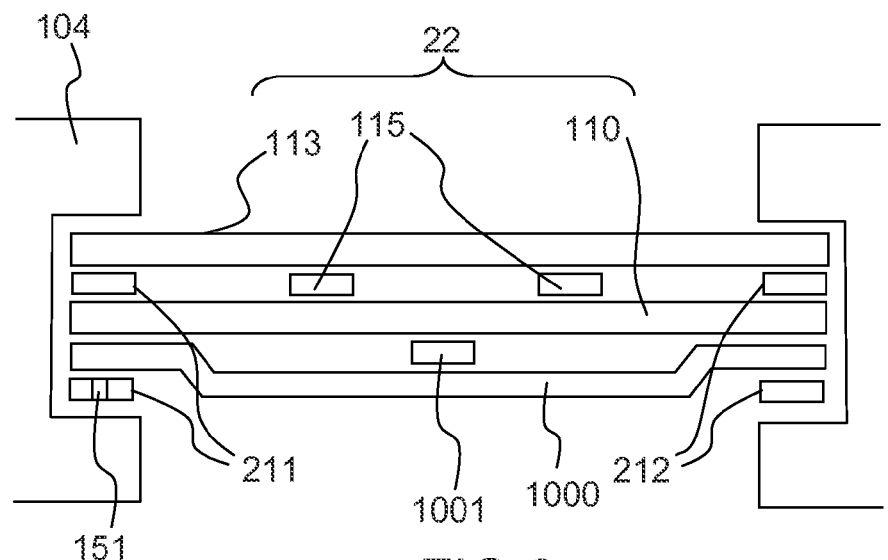
FIG. 6 shows a cross section of an assembly of an electronic board with its thermal drain, its locking means and a secondary thermal drain according to the invention.

FIG. 6 shows, in cross section, one assembly of an electronic board 22 with its thermal drain 113 and its two locking means 211 and 212. All these elements are identical to FIG. 4b. The configuration shown in FIG. 6 additionally comprises a secondary thermal drain 1000. The retaining hole 151 may also be used to fix the secondary thermal drain 1000 onto the underside of the printed circuit 110 used to evacuate the heat from the components 1001 and/or to provide an electrostatic protection, without occupying any surface area of the printed circuit intended to accommodate components and/or tracks.

Figure 7:
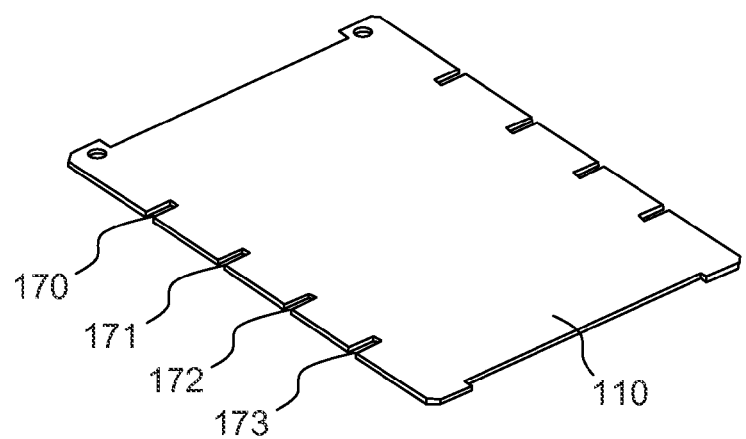
FIG. 7 shows the printed circuit according to the invention.

FIG. 7 shows the printed circuit 110 according to the invention. The printed circuit 110 comprises two notches 170, 171 along one edge designed to fit into the recess 231 of the mobile part 117 of the expandable locking means 211. The notches 170 and 171 bound the region 141 entering into the recess 231. If FIG. 5 is considered with the three regions 141, 142 and 143 of the printed circuit 110 entering in the recesses 231, 232 and 233, the printed circuit 110 requires four notches 170, 171, 172 and 173. More generally, for an expandable locking means with n recesses, the printed circuit has n+1 notches. The number n of recesses of the locking means results from a compromise between the installation of the electronic board 22 and the robustness of the assembly. The invention allows the implementation of a single printed circuit compatible with a cooling by convection and by conduction, without having to carry out a rework of the board in order to convert a board assembled with its electronic components from the convection cooling mode to the conduction cooling mode. Irrespective of the type of cooling envisaged later on, only one type of printed circuit is manufactured and stored. Once the printed circuit has been assembled, it is not necessary to re-machine it to go from a circuit using cooling by convection to a circuit using cooling by conduction. The reverse operation may perfectly well be envisaged. It may be desired to go from a circuit using cooling by conduction to a circuit using cooling by convection. This may be the case where a more severe pass/fail test in temperature exists for a circuit using cooling by conduction. The assembled boards that fail the test can then be used for a cooling by convection for which the range of temperature is generally less severe.

The invention claimed is:

1. An electronic board comprising:
   a printed circuit;
   a thermal drain positioned on the printed circuit parallel to the printed circuit; and
   an expandable locking means positioned along one edge of the printed circuit including:
     a part for transmission of movement, and
     a mobile part that is mobile in translation along an axis and includes a component perpendicular to the printed circuit, the mobile part disposing of at least one recess opening onto a face of the expandable locking means perpendicular to the printed circuit,
   wherein the expandable locking means being designed to rigidly fix the electronic board in a chassis and to press the thermal drain against a face of the chassis,
   wherein the printed circuit comprises a region which enters into the at least one recess of the expandable locking means;
   wherein the expandable locking means includes an upper surface positioned between the thermal drain and the printed circuit along the axis, and
   wherein the upper surface of the expandable locking means contacts the thermal drain.

2. The electronic board according to claim 1,
   wherein the mobile part has an elongated shape running along one edge of the printed circuit, including a respective face perpendicular to the printed circuit, and
   wherein the at least one recess opens onto the face of the expandable locking means perpendicular to the printed circuit so as to receive the region of the printed circuit.

3. The electronic board according to claim 1, wherein the at least one recess is a blind recess.

4. The electronic board according to claim 1, wherein the at least one recess is a through-recess.

5. The electronic board according to claim 4, wherein the region of the printed circuit protrudes from the at least one recess.

6. The electronic board according to claim 4,
   wherein the mobile part includes a lower part having at least one hole passing through the lower part,
   wherein the hole is designed to allow the passage of a means for retaining the thermal drain on the printed circuit.

7. The electronic board according to claim 5,
   wherein the mobile part includes a lower part having at least one hole passing through the lower part,
   wherein the hole is designed to allow the passage of a means for retaining the thermal drain on the printed circuit.

8. The electronic board according to claim 4, wherein the mobile part of the expandable locking means has several recesses opening onto the face of the expandable locking means perpendicular to the printed circuit.

9. The electronic board according to claim 8, wherein the printed circuit includes notches along one edge designed to fit into the recesses of the mobile part of the expandable locking means, the notches bounding the regions entering into the recess or recesses.

* * * * *

UNITED STATES PATENT AND TRADEMARK OFFICE
CERTIFICATE OF CORRECTION

| | | |
|---|---|---|
| PATENT NO. | : 9,307,629 B2 | Page 1 of 1 |
| APPLICATION NO. | : 14/524897 | |
| DATED | : April 5, 2016 | |
| INVENTOR(S) | : Serge Tissot et al. | |

It is certified that error appears in the above-identified patent and that said Letters Patent is hereby corrected as shown below:

On the title page

Please insert item (30) the foreign priority information as follows:

-- (30)   Foreign Application Priority Data

Oct. 28, 2013   (FR) .................................. 13 59425 --

Signed and Sealed this
Seventh Day of June, 2016

Michelle K. Lee
*Director of the United States Patent and Trademark Office*